United States Patent [19]

Hertz

[11] 3,976,980
[45] Aug. 24, 1976

[54] DATA REORDERING SYSTEM

[75] Inventor: Theodore M. Hertz, Whittier, Calif.

[73] Assignee: Rockwell International Corporation, El Segundo, Calif.

[22] Filed: Jan. 9, 1969

[21] Appl. No.: 789,998

[52] U.S. Cl. ............................................. 340/172.5
[51] Int. Cl.[2] ...................... G06F 7/10; G06F 9/10
[58] Field of Search ........................ 340/172.5, 347

[56] References Cited
UNITED STATES PATENTS

| | | | |
|---|---|---|---|
| 3,333,251 | 7/1967 | Brenza et al. .................. | 340/172.5 |
| 3,394,350 | 7/1968 | Packard .......................... | 340/172.5 |
| 3,400,375 | 9/1968 | Bowling et al. ................ | 340/172.5 |
| 3,475,732 | 10/1969 | Avsan et al. .................... | 340/172.5 |
| 3,526,878 | 9/1970 | Bennett et al. ................ | 340/172.5 |
| 3,541,516 | 11/1970 | Senzig ............................ | 340/172.5 |

*Primary Examiner*—Howard A. Birmiel
*Attorney, Agent, or Firm*—H. Fredrick Hamann; Rolf M. Pitts

[57] ABSTRACT

A first addressable memory stores data received from an external source. The data addresses storage locations in a second memory which also stores data received from an external source. Registers and logic are provided for transferring data between the memories.

Data is stored in the second memory and address locations for the second memory are stored in the first memory in accordance with a desired data order. The first memory is addressed and the address data in its locations is replaced by data from the second memory in a desired order. Subsequently, it is read out from an output register.

1 Claim, 2 Drawing Figures

DATA REORDERING SYSTEM

BACKGROUND OF THE INVENTION

1. Field of the Invention

The invention relates to a system using data from an address location in one memory to address data in a second memory for reordering data.

2. Description of the Prior Art

Development of the data processing field has resulted in the use of a plurality of different codes, or character identifications. For example, one code may be comprised of 8 bits, whereas another code may be comprised of 6 bits. In still another example, two 8-bit codes may be used comprising different symbols. Before systems organized for different codes can be interconnected, the two codes, or the systems, must be made compatible. Since it may be too expensive to redesign hardware or to change codes for such applications, it would be better to provide a means for converting from one code to another. The conversion means may by a separate system although in a practical system, a special command may be provided in a data processing system for using conversion hardware in the system.

Ordinarily, the conversion means may be a computer program which executes a sub-routine each time the presence of a different code is detected. In other systems, the different codes may be stored together so that each time one code is detected, the equivalent code stored at an adjacent location is read out. Twice the storage capacity is required in dual storage systems.

Such systems require time and use storage space that could be used for other purposes. It would be more desirable to provide a simple code converter system which could convert directly from one code to another. In that manner, systems using one code could be connected through the converter to the systems using a different code. There would be no requirement to redesign or program sub-routines.

There would, however, be a requirement for storing the conversion data prior to an interconnection. Different data could be stored to accommodate various conversions.

There is also a requirement for a system which can easily reorder data. Since a code conversion system in effect reorders data, the same system can be used for both applications by selectively addressing the data in the memories.

SUMMARY OF THE INVENTION

Briefly, the invention is a data processing system comprising a first addressable memory in which digital data representing address locations in a second memory is stored in consecutive address locations of the first memory.

In a code conversion mode, data in the first memory is used to address locations in the second memory. The data of the first memory represent one computer code which become the addresses of the stored data in the second memory which represent a second code. The second memory data replaces the address data in the first memory so that when the first memory locations are readdressed, the first memory provides a converted code output.

If the system is operated in a data reordering mode, data is stored in the second memory and address locations for the second memory are stored in locations in the first memory in accordance with a desired data order. The first memory is addressed and the address data in the storage locations is replaced by data from the second memory in a desired order. When the first memory locations are readdressed, it provides a reordered data output.

In one embodiment, the addressable memories may be comprised of a plurality of core layers, with each layer forming a core matrix. Input and output means may be comprised of registers, with the input register comprising gating networks for addressing selected cores in each of the planes.

In another embodiment, the addressable memories may be comprised of storage circuits implemented by field effect devices such as MOS devices. A single chip of memory circuits would replace a layer of the core matrix. Memory circuits which can be used to implement the addressable circuits can be seen by referring to patent application entitled MEMORY CIRCUIT USING STORAGE CAPACITANCE AND FIELD EFFECT DEVICES, filed on or about Dec. 30, 1968, by Robert K. Booher.

Another embodiment of the converter may be comprised of a plurality of recirculating registers, or a single recirculating register divided into segments on, for example, a rotating drum or disc, or a magnetostrictive or other type of delay line.

Therefore, it is an object of this invention to provide a system for processing data between addressable memories in order to convert from one digital code to another or for reordering the data stored in one of the memories.

It is another object of this invention to provide a memory storage system for directly converting from one computer code to another computer code.

It is another object of this invention to provide a data processing system for reordering data by transferring data from one addressed memory to another.

It is still another object of this invention to provide a code converter system without the necessity for a programmed subroutine conversion.

A still further object of this invention is to provide a system for directly converting between computer codes for permitting interconnection of computing systems using different codes.

Still another object of this invention is to provide an improved code conversion system without the necessity of utilizing storage space within the data processing systems interconnected.

Still a further object is to provide a process and structure for improving conversions between computer codes permitting greater utilization of data processing systems.

A still further object of this invention is to provide a code conversion system which can be used to convert between several codes by changing the data stored in memories of the system.

These and other objects of this invention will become more apparent in connection with the following drawings:

DESCRIPTION OF PREFERRED EMBODIMENT

Figure 1A:
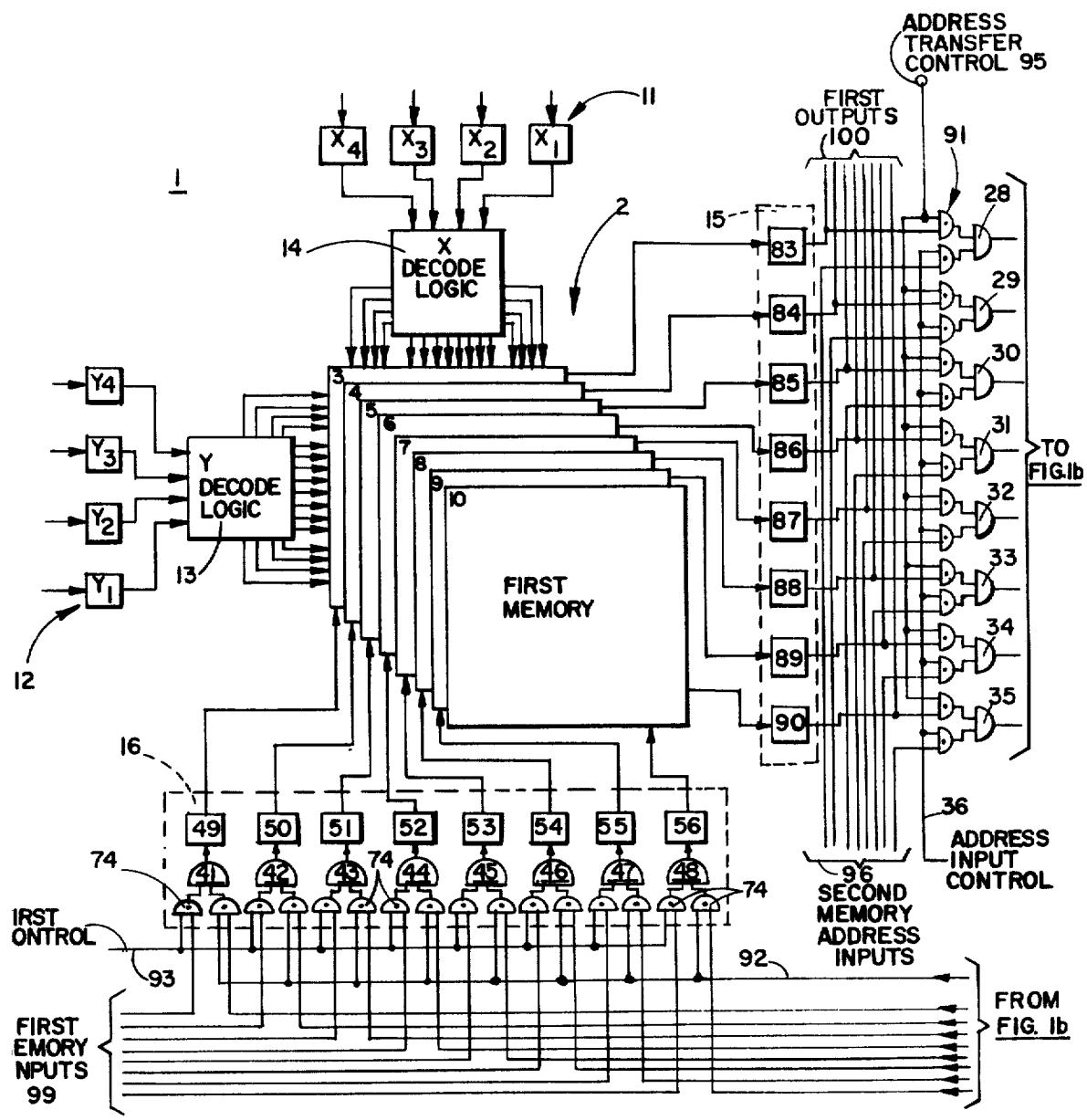
FIG. 1a illustrates the first memory portion of a data processing system.

FIG. 1a is a schematic illustration of one-half of data processing system 1 which can be operated in a code conversion mode for converting from one computer code to another computer code and in a data reordering mode for reordering stored data. The system includes first memory 2 comprising 8 toroidal storage layers 3–10 which form a matrix of wire wound core storage elements for each layer. Each matrix includes 16 rows (Y) and 16 columns (X) of core storage elements so that a possible 256 bits of information can be stored in each layer.

X and Y address registers 11 and 12 for the storage layers 3–10 comprise flip flops $X_4$ through $X_1$ and $Y_4$ through $Y_1$, respectively. X and Y address decode logic 13 and 14 decode the counts represented by the states of the flip flops to address core storage elements in each layer. For example, if the output of each flip flop is false, (logic 0) the first line of each of the two sets of 16 lines between the decode logic and the storage layers would be true and the first storage location along the X and Y axes of the matrix would be addressed. If the output of each flip flop is true (logic 1) the last line of each of the two sets of 16 lines between the decode logic and the storage layers of the first memory would be true and the 16th storage location along the X and Y axes would be addressed.

Storage locations between the first and last locations would be addressed as the X and Y flip flops counted from 0000, 0000 to 1111, 1111. Only one of each of the two sets of 16 lines is true for each count. Decode logic, flip flops, and toroidal storage layers, are represented generally since details on specific embodiments are well known to persons skilled in the art.

Flip flops $X_4$ through $X_1$ address the most significant bits of storage locations in first memory 2 and flip flops $Y_4$ through $Y_1$ address the least significant bits of storage locations in memory 2.

The FIG. 1a portion of the system also includes input register 16 comprising 8 flip flops 49 through 56 connected to the storage elements of the layers 3–10, respectively. The outputs of the flip flops are set true or false as a function of the state of OR gates 41 through 48 which are controlled by AND gates 74.

The outputs of the flip flops are connected to the core storage elements of the storage layers so that as corresponding storage elements in the layers are addressed by the decoded counts of address registers 11 and 12 the data represented by the states of the flip flop outputs is stored.

For example, if the address register contains a count representing the first address location in each layer, the data represented by the states of the flip flops 49 through 56 would be stored in the first storage location of each of the layers 3–10.

Alternate ones of the AND gates 74 receive data from the first memory input lines 99 when the first input control line 93 is true. The other AND gates receive data from storage locations in the second memory 17 (shown in FIG. 1b) when the data transfer line 92 is true.

Output register 15 comprising 8 flip flops, 83 through 90, receives data from addressed locations in the first memory 2. The flip flops 83 through 90 are connected to receive outputs from addressed core storage elements in layers 3–10 respectively.

Outputs from the flip flops pass through alternate ones of AND gates 91 when the address transfer control line 95 is true. Second memory address inputs on lines 96 pass through the other AND gates when address control line 36 is true Outputs from the AND gates 91 pass through OR gates 28 through 35 to the portion of the system shown in FIG. 1b.

Figure 1B:
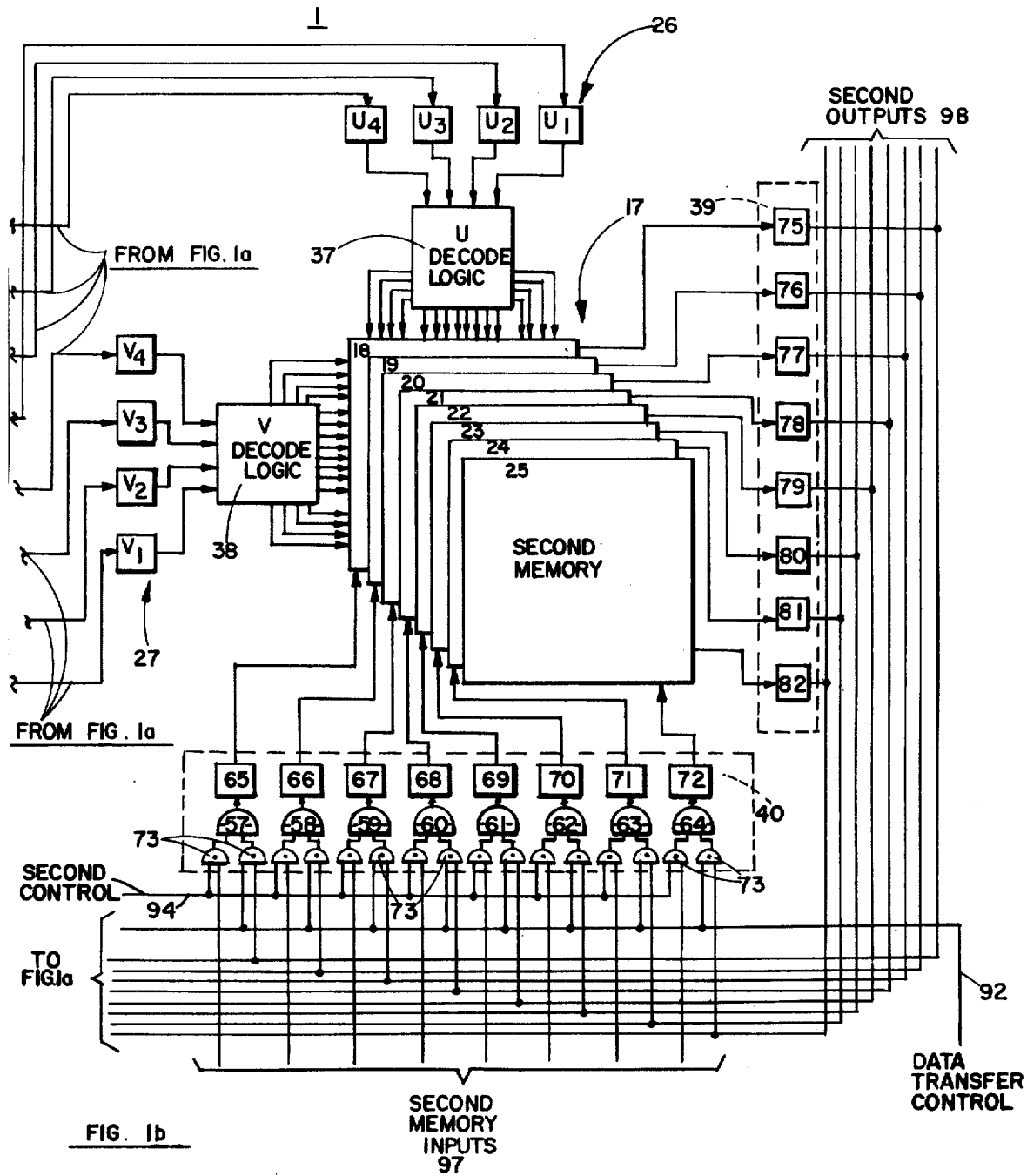
FIG. 1b illustrates the second memory portion of the data processing system.

FIG. 1b is a schematic illustration of the remaining portion of the system comprising second memory 17. The second memory includes eight toroidal storage layers 18 through 25 which form a matrix of wire wound core storage elements for each layer. As indicated in connection with first memory 2, each matrix of second memory 17 is comprised of 16 rows (V) and 16 columns (U) of core storage elements so that a possible 256 bits of data can be stored in each layer. U and V address registers 26 and 27 are comprised of flip flops $U_4$ through $U_1$ and $V_4$ through $V_1$, respectively. The flip flops receive data through OR gates 28 through 35 from either the first memory 2 or from second memory address input lines 96 as previously described.

Flip flops $U_4$ through $U_1$ address the most significant bits of storage locations in memory 17 and flip flops $V_4$ through $V_1$ address the least significant bits of storage locations in memory 17. Outputs from the storage layers 3 through 6 (representing the most significant bits) are used as address bits for the U register 26 and outputs from the storage layers 7 through 10 (representing the least significant bits) are used as address bits for the V register 27.

The second memory 17 receives input data from register 40 comprising flip flops 65 through 72. The flip flops 65 through 72 are connected to core storage elements in layers 18 through 25, respectively. OR gates 57 through 64 provide inputs to the flip flops as a function of the data appearing on the second memory input lines 97 when the second control line 94 is true. The data passes through alternate ones of AND gates 73 as shown. When data transfer control line 92 is true, data is provided to the second memory 17 from output register 39 through the other AND gates. The data from register 39 is also provided to the first memory 2 indicated previously in connection with FIG. 1a.

It is pointed out that the data on the first and second memory input lines 99 and 97 may be received from an external source such as a computer or from the computing system of which the data processing system 1 is a part.

Output register 39 comprising flip flops 75 through 82 receives data from addressed locations in memory 17. The flip flops 75 through 82 are connected to receive outputs from addressed core storage elements of layers 18 through 25, respecitvely. The output data may be read out to an external device (not shown) on second output lines 98 or the data may be used to replace the data in addressed locations in first memory 2 and to restore the data read from addressed locations in second memory 17.

Initially, address input control line 36 is true and second memory 17 is addressed by the data appearing on second memory address input lines 96. As each storage element of the second memory 17 is addressed, data from register 40 is stored in the memory. The sequence is repeated until data is stored in all required locations in the second memory 17. For example, in a code conversion mode, all necessary code conversion data would be stored in second memory 17 so that all possible code conversions could be made. In a reordering mode, the data to be reordered would be stored in second memory 17.

It is pointed out that the code conversion data as well as the data to be reordered can be changed if desired. As a result, the system has improved operating flexibility over the fixed conversion and reordering systems. The present system can be used to reorder many sets of data in the same or different ways and to convert many sets of data between the same or different computer codes.

After data on the second memory input lines 97 has been stored in the second memory 17 and after the data on the first memory input lines 99 has been stored in the first memory 2, the address transfer control line 95 becomes true and the data from the first memory 2 is used to address locations in the second memory 17. The address locations in the second memory 17 are addressed randomly as a function of the data stored in the first memory 2. Address locations in the first memory 2 can be addressed consecutively or randomly depending on a particular application.

When the system is operated in a code conversion mode, addresses of the second memory 17 (representing one computer code) are stored in address locations in the first memory 2. The addresses stored as data in first memory 2 represent one computer code. Data representing a second computer code is stored in the addressed locations in the second memory 17 corresponding to the stored addresses in the first memory 2.

During a code conversion sequence, locations in the first memory 2 are addressed under the control of the X and Y registers. The addressed data is received by the U and V registers shown in FIG. 1b for addressing locations in the second memory. The data in the addressed locations in second memory 17 is read out by the output register 39. Since data transfer line 92 is true, the data is restored in the address location in second memory 17 by register 40. In addition, the data is read into first memory 2 by register 16 to replace the addressed data stored in the same previously addressed location in the first memory 2.

In one application, all the address locations in the first memory are addressed as the X and Y registers pass through a counting cycle for converting all the data representing one computer code into the other computer code. After all the first computer code data has been replaced by the converted computer code data, the first memory 2 is readdressed by the X and Y registers to read out the converted computer code data through register 15 on output lines 100. Alternately, a single data character can be converted by the system and read out without the necessity of converting blocks of data and reading out the blocks of data in sequence as indicated above.

For a specific illustration, suppose that the address 27 representing one character of a computer code is stored in the first address location (count 0 of the X and Y registers) of the first memory 2. Suppose further that the number 27 converts into the number 32 of a second computer code. The number 32 would be stored in address location 27 of second memory 17.

In order to convert from the number 27 of the first code to the number 32 of the second code, storage location 0 in the first memory 2 would be addressed and the number 27 would be used by the U and V registers to address storage location 27 in the second memory 17. Storage location 27 would contain the number 32 which would be read out by output register 39. The number 32 would then be restored into location 27 of the second memory 17 so that additional conversions can be made. In addition, the number 32 would replace the number 27 in storage location 0 in the first memory 2. Thereafter, when storage location 0 of the first memory 2 is addressed, the number 32 representing the converted code would appear on the output lines 100.

When the system is operated in a data reordering mode, the data to be reordered is initially stored in the second memory 17. Addresses for the second memory 17 are stored in the first memory 2 in storage locations as a function of the desired reorder for the data.

For example, suppose it is desired to reorder the data stored in address location 32 of memory 17 into address location 1 of first memory 2. The number 32 would be previously stored in location 1 of first memory 2 so that when location 1 is addressed, the number 32 would be used by the U and V registers to address the location 32 in second memory 17. The data in that location for example, the number 27, would be rewritten into location 32 in second memory 17 and would replace the number 32 in storage location 1 of first memory 2. When the address location 1 is again addressed by the X and Y registers, the numbers 27 would be read out on output lines 100 in its reordered sequence.

The reordering mode is useful in editing data for output to line printers, typewriters, or other output devices. For example, when data is to be tabulated, it may be necessary to insert print symbols such as spaces, dollar signs, decimal points, capital letters, commas, etc. (not normally present in the raw data). The symbols are then stored in the second memory 17 along with the data to be reordered. Addresses for the symbols are stored in the first memory 2 so that when the data is reordered, the symbols are inserted at the proper positions relative to the final reordered data.

While the invention has been described with respect to several physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. A data reordering system including first and second memories, said system comprising,
    means for storing data in the first memory, said stored data being address locations in said second memory,
    means for storing data in address locations in the second memory in a random order,
    means addressing the data stored in the first memory, means responsive to said stored data for addressing locations in the second memory, said first memory being addressed for selecting a predetermined order of address locations in said second memory,
    means for replacing the stored address locations in the first memory with the data in the addressed locations of said memory whereby the data stored in the second memory in a random order is reordered by addressing the address locations in the first memory in a predetermined order,
    means for readdressing the previously addressed locations in the first memory for reading out the reordered data.

* * * * *